United States Patent [19]

Takeda

[11] Patent Number: 4,680,226
[45] Date of Patent: Jul. 14, 1987

[54] HEAT SENSITIVE TYPE ADHESIVE CONNECTOR

[75] Inventor: Yoshio Takeda, Nara, Japan

[73] Assignee: Sharp Kabushiki Kaisha, Osaka, Japan

[21] Appl. No.: 821,965

[22] Filed: Jan. 24, 1986

[30] Foreign Application Priority Data

Jan. 28, 1985 [JP] Japan .................................. 60-14952

[51] Int. Cl.$^4$ ............................................... B32B 5/16
[52] U.S. Cl. .......................................... 428/327; 428/1; 428/901
[58] Field of Search ........................... 428/327, 901, 1

[56] References Cited

U.S. PATENT DOCUMENTS 4,526,818  7/1985  Hoshikawa ............................ 428/1
4,615,919 10/1986  Inoue ..................................... 428/1

*Primary Examiner*—Marion C. McCamish
*Attorney, Agent, or Firm*—Birch, Stewart, Kolasch & Birch

[57] ABSTRACT

A heat sensitive type adhesive connector for providing electrical connection between terminals disposed on bases including a sheet made of heat sensitive type adhesive material for adhering said bases together, and electrically conductive and elastic particles mixed in the sheet, for providing electrical connection between the terminals.

14 Claims, 6 Drawing Figures

HEAT SENSITIVE TYPE ADHESIVE CONNECTOR

BACKGROUND OF THE INVENTION

The present invention relates to a heat sensitive type adhesive connector, and more particularly, to a heat sensitive type adhesive connector such as a hot press type adhesive connector mixed with electrically conductive elastic particles in a heat sensitive resin material.

A conventional hot press type adhesive tape connector as shown in FIGS. 5 and 6. The hot press type adhesive tape connector comprises a resin tape 1' and electrically conductive rigid particles 2', for example, metal powders such as Ag, Ni, and Cu, and carbon fibers mixed in the resin tape 1'.

When printed circuit substrate 3 and a glass substrate 5 are electrically connected to each other, the hot press type adhesive tape connector is sandwiched between terminals 4 of the printed circuit substrate 3 and terminals 6 of the glass substrate 5, as shown in FIG. 6. The printed circuit substrate 3, the hot press type adhesive tape connector, and the glass substrate 5 are layered and pressed by pressure from the sides of the substrates 3 and 5 facing the outside. Then the hot press adhesive tape is heated. Therefore, the substrates 3 and 5 are adhered and integrally connected to each other by the adhesion of the resin material 1' of the hot press type adhesive tape connector. When adhering, the electrically conductive and rigid particles 2' provide the electrically connection between the terminals 4 of the substrate 3 and the terminals 6 of the substrate 5.

However, the electrically conductive particles 2' of the hot press type adhesive tape connector are rigid or hard. When pressing, the electrical conductivity may be reduced by producing a separation between the electrically conductive particles 2 or between the electrically conductive particles and the terminals 4 or 6 of the substrate 3 or 5. Therefore, the heating temperature, the compression pressure, and the period of time for the hot pressing process must be accurately selected. Also, since the hot press type adhesive tape may expand or shrink, the electrical conductivity may be reduced by separation caused between the electrically conductive particles 2 and the substrate 3 or 5 or between the electrically conductive particles 2.

It is thus desired to provide an improved heat sensitive type adhesive connector which provides high electrical conductivity.

SUMMARY OF THE INVENTION

Accordingly, it is an object of the present invention to provide an improved heat sensitive type adhesive connector which provides high electrical conductivity.

It is another object of the present invention to provide an improved heat sensitive type adhesive connector which provides an accurate electrical connection between terminals.

It is a further object of the present invention to provide an improved hot press type adhesive connector in which electrically conductive particles and elastic particles are mixed in a resin material.

Other objects and further scope of applicability of the present invention will become apparent from the detailed description given hereinafter. It should be understood, however, that the detailed description of and specific examples, while indicating preferred embodiments of the invention, are given by way of illustration only, since various changes and modifications within the spirit and scope of the invention will become apparent to those skilled in the art from this detailed description.

To achieve the above objects, according to an embodiment of the present invention, a heat sensitive type adhesive connector comprises a sheet made of a heat sensitive adhesive material such as a resin, and electrically conductive particles and elastic particles mixed in the sheet.

The electrically conductive particles have a heat resistance, and the hardness of the electrically conductive particles are more than that of the adhesive sheet.

The electrically conductive particles may be formed such that the electrically conductive material (powder) is mixed in an elastic resin material.

The electrically conductive particles may be an electrically conductive organic material.

The electrically conductive particles may be formed such that an electrically conductive material is covered on an elastic resin material.

BRIEF DESCRIPTION OF THE DRAWINGS

The present invention will be better understood from the detailed description given hereinbelow and the accompanying drawings which are given by way of illustration only, and thus are not limitative of the present invention and wherein.

DETAILED DESCRIPTION OF THE PREFERRED EMBODIMENTS

Figure 1:
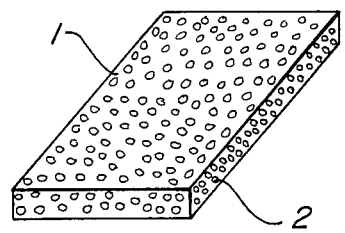
FIG. 1 shows a perspective view of a heat sensitive type adhesive connector such as the hot press type adhesive connector according to an embodiment of the present invention.

FIG. 1 shows a perspective view of the heat sensitive type adhesive connector such as a hot press type adhesive tape connector according to an embodiment of the present invention. The heat sensitive type adhesive connector comprises a connector tape 1 made of an adhesive resin material and an electrically conductive and elastic particles 2 uniformly scattered and suspended in the adhesive connector tape 1.

Figure 2:
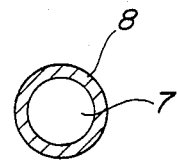
FIG. 2 shows a sectional view of an electrically conductive elastic particle used in the heat sensitive type adhesive connector of the present invention.

For example, as shown in FIG. 2, each of the electrically conductive particles 2 is formed as follows: an elastic resin material such as a silicone rubber, a polyimide resin, a synthetic resin, or a plastic material, is formed in a spherical shape, and then, a metal 8 such as Cu, Ni, Au, Cr, Al, etc. is coated on the surface of the spherical resin particle 7 by using a sputtering deposition method or an electroless plated coating method.

The shape of the electrically conductive particles 2 should not be limited to a spherical shape. For example, the electrically conductive particles 2 may be formed into a cylindrical shape, and furthermore into other shapes.

The hardness of the electrically conductive particles 2 is more than that of the resin material of the adhesive connector tape 1. This is useful for electrical connection and assures that the electrically conductive and elastic particles 2 are in close contact with each other when pressing and heating.

Although with regard to the elasticity of the electrically conductive particles 2, the hardness of the electrically conductive particles 2 must be more than that of the connector tape 1 made of an adhesive resin. The hardness of the electrically conductive particles 2 is selected from the range between about 30 degrees and 80 degrees for a penetrometer.

The material of the adhesive connector tape 1 may be a rubber type resin, a polyester type resin, a polyamide type resin, etc.

Figure 3:
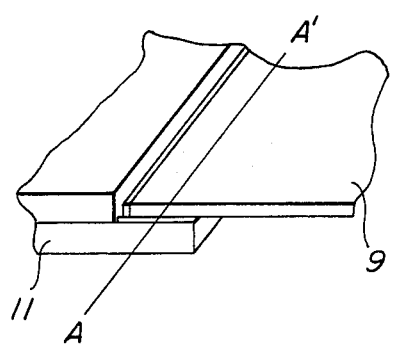
FIG. 3 shows a perspective view of a connection between two substrates by using the heat sensitive type adhesive connector of the present invention.
Figure 4:
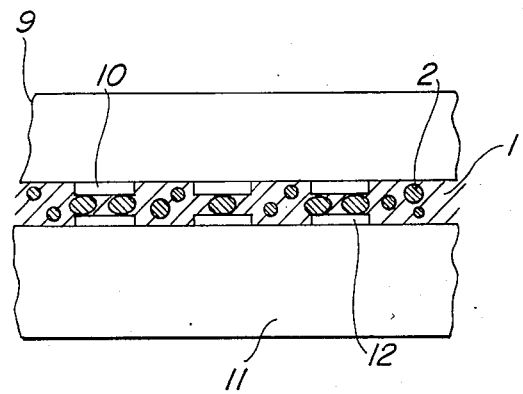
FIG. 4 shows a sectional view of the connection between the two substrates of FIG. 3 taken along line A—A'.
Figure 5:
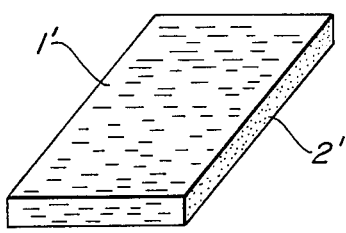
FIG. 5 shows a perspective view of a conventional hot press type adhesive tape connector.
Figure 6:
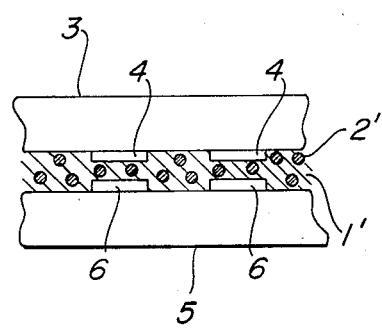
FIG. 6 shows a sectional view of a connection between two substrates by using a conventional connector.

FIG. 3 shows an example of a connection between a glass substrate of a liquid crystal display cell and a flexible substrate. FIG. 4 shows a sectional view of the connection of FIG. 3 taken along line A—A'. The heat sensitive type adhesive connector according to an embodiment of the present invention will be described below. A flexible substrate 9 has terminals 10 formed in such a manner that a metal such as Au or solder is plated on Cu patterns formed on the surface of the substrate 9. A glass substrate 11 for a liquid crystal display cell has transparent electrodes 12 made of $In_2O_3$ or $SnO_2$.

First, the heat sensitive type adhesive connector is sandwiched between the flexible substrate 9 and the glass substrate 11 so that each of the terminals 10 faces each of the electrodes 12 via the heat sensitive type adhesive connector. After the insertion of the connector, the combination of the substrate 9, the connector, and the substrate 11 is depressed from the surface of the substrate 9 facing to the outside, and at the same time, heated. For example, the heating temperature may be selected from the range between about 80 degrees C. and about 200 degrees C., and the depression pressure may be selected from the range between about 1 Kg/cm$^2$ and about 50 Kg/cm$^2$.

The hot press connection elastically changes the shape of the electrically conductive particles 2 as shown in FIG. 4. The particles 2 are crushed in an elliptical shape by the pair of the terminals 10 and the electrodes 12. Therefore, the elliptical crushed particles 2 provides the force for the expansion in the directions toward the terminals 10 and the electrodes 12. Accordingly, the particles 2 are in close contact with each other, and also the particles 2 and either the terminals 10 or the electrodes 12 are in close contact with each other.

Even when the portions to be connected, or, the portion formed the terminals may be weak, the elasticity of the particles 2 provides the strong connection without the breakage of the connection portion.

Since only a metal layer is coated on the surface of each of the particles 2, it is not expensive, even when a precious metal is used as the surface coating metal.

If the electrically conductive particles 2 are formed by the sputtering method, it is effective that the particle type resins are vibrated during sputtering.

If the deposition method such as an electron beam or a resistance heating method are used, it is effective that the particle type resins fall and is deposited. In this case, the silicone type resin or an epoxide resin may be used for the electrically conductive particles 2.

Although, in the present invention, the spherical resin particles having a metal layer on the surface of the particle are used as the electrically conductive particles, the electrically conductive particles may be formed by an electrically conductive organic material such as polyacetylene type electrically conductive organic material. Also, the electrically conductive particles may be formed such that an electrical conductive material is mixed in an elastic resin material. For example, electrically conductive rubber formed in the pherical particles which is dispersed and mixed with electrically conductive powder such as carbon powder, etc. may be used as the particles 2.

As described above, the heat sensitive type adhesive connector comprises the adhesive resin tape, and the electrically conductive and elastic particles mixed in the adhesive resin tape. The reliability of the electrical connection becomes high, and it is easily used.

The heat resistance of the electrically conductive particles may be relatively high. The heat resistance is selected by the selection of the material of the electrically conductive particles of the present invention.

Even when the force from the outside is applied to the connector, the pressure produced by the force is absorbed by the electrically conductive and elastic particles, so that the electrically connection can be assured.

The connector of the present invention may be formed as a tape or a sheet.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A heat sensitive type adhesive connector for providing electrical connection between terminals disposed on base members comprising:
a sheet made of a heat sensitive resin-type adhesive material, for causing said base members to adhere together; and
electrically conductive and elastic particles uniformly scattered in the sheet, for providing electrical connection between the terminals.

2. The heat sensitive type adhesive connector of claim 1, wherein said electrically conductive particles have a relatively high heat resistance.

3. The heat sensitive type adhesive connector of claim 1, wherein the hardness of the electrically conductive particles is more than that of said sheet.

4. The heat sensitive type adhesive connector of claim 1, wherein each of the electrically conductive particles comprises an elastic resin material and an electrically conductive material coated on said elastic resin material.

5. The heat sensitive type adhesive connector of claim 4, wherein the elastic resin material is selected from a silicone rubber, a polyimide resin, a synthetic rubber, and a plastic.

6. The heat sensitive type adhesive connector of claim 4, wherein the electrically conductive material is a metal.

7. The heat sensitive type adhesive connector of claim 6, wherein the metal is selected from Cu, Ni, Au, Cr, and Al.

8. The heat sensitive type adhesive connector of claim 1, wherein each of the electrically conductive particles comprises an elastic resin material and electrically conductive material mixed in the elastic resin material.

9. The heat sensitive type adhesive connector of claim 8, wherein the electrically conductive material is a carbon powder.

10. The heat sensitive type adhesive connector of claim 1, wherein the electrically conductive particles are made of an electrically conductive organic material.

11. The heat sensitive type adhesive connector of claim 10, wherein the organic material is a polyacetylene type electrically conductive material.

12. The heat sensitive type adhesive connector of claim 1, wherein the hardness of the electrically conductive particles is selected from the range between about 30 degrees and about 80 degrees for a penetrometer.

13. The heat sensitive type adhesive connector of claim 1, wherein said heat sensitive adhesive material is selected from a rubber type resin, a polyester type resin, and a polyimide type resin.

14. A heat sensitive type adhesive connector for providing electrical connection between a first terminal of a first base and a second terminal of a second base, said connector comprising:
 a sheet made of a heat sensitive type adhesive material for providing adherence between said first and second bases;
 electrically conductive and elastic particles uniformly scattered in said sheet, for providing electrical connection between said first and second terminals, said elastic particles being pressed and placed between said first and second terminals, whereby said elastic particles apply an expansion force to said first and second terminals.

* * * * *